United States Patent
Yi et al.

(10) Patent No.: US 9,129,872 B2
(45) Date of Patent: Sep. 8, 2015

(54) IMAGING PIXELS WITH IMPROVED PHOTODIODE STRUCTURES

(71) Applicant: Semiconductor Components Industries, LLC, Phoenix, AZ (US)

(72) Inventors: Xianmin Yi, Menlo Park, CA (US); Paul Perez, Boise, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 14/031,691

(22) Filed: Sep. 19, 2013

(65) Prior Publication Data

US 2014/0077325 A1    Mar. 20, 2014

Related U.S. Application Data

(60) Provisional application No. 61/703,574, filed on Sep. 20, 2012.

(51) Int. Cl.
*H01L 27/146* (2006.01)
*H01L 31/0352* (2006.01)

(52) U.S. Cl.
CPC ...... *H01L 27/14605* (2013.01); *H01L 27/1461* (2013.01); *H01L 31/03529* (2013.01); *H01L 27/14643* (2013.01)

(58) Field of Classification Search
CPC .................. H01L 27/14605; H01L 31/03529; H01L 27/1461; H01L 17/14643
See application file for complete search history.

(56) References Cited

U.S. PATENT DOCUMENTS

| | | | | |
|---|---|---|---|---|
| 5,696,998 A | * | 12/1997 | Yamada et al. | 396/51 |
| 6,563,538 B1 | * | 5/2003 | Utagawa | 348/273 |
| 7,009,227 B2 | | 3/2006 | Patrick et al. | |
| 7,633,134 B2 | | 12/2009 | Hynecek | |
| 7,749,798 B2 | * | 7/2010 | Rhodes et al. | 438/75 |
| 7,910,394 B1 | | 3/2011 | Ershov | |
| 8,275,207 B2 | * | 9/2012 | Okamoto et al. | 382/232 |
| 8,614,755 B2 | * | 12/2013 | Takamiya et al. | 348/277 |
| 2006/0008159 A1 | * | 1/2006 | Kobayashi | 382/232 |
| 2014/0239156 A1 | * | 8/2014 | Hayashi et al. | 250/208.1 |

* cited by examiner

*Primary Examiner* — William Coleman
(74) *Attorney, Agent, or Firm* — Treyz Law Group; Kendall P. Woodruff

(57) ABSTRACT

A photodiodes may be formed on a substrate such as an imager substrate. The photodiode may include first and second layers in the substrate that form a p-n junction. The first layer may have a first doping type such as p-type doping, whereas the second layer may have a second, opposite doping type such as n-type doping. A counter-doping implant region may be provided that only partially overlaps with the second layer of the photodiode. The counter-doping implant region may have an opposite doping type to the second layer and may have a dopant concentration that is less than the dopant concentration of the second layer. The counter-doping implant region may extend into a third layer of the substrate that may have the same doping type of the second layer but at a lower concentration than the counter-doping implant region.

20 Claims, 4 Drawing Sheets

IMAGING PIXELS WITH IMPROVED PHOTODIODE STRUCTURES

This application claims the benefit of provisional patent application No. 61/703,574, filed Sep. 20, 2012 which is hereby incorporated by reference herein in its entirety.

BACKGROUND

This relates generally to imaging systems, and more particularly to imaging systems with improved capacity.

Modern electronic devices such as cellular telephones, cameras, and computers often use digital image sensors. Imagers (i.e., image sensors) may be formed from a two-dimensional array of image sensing pixels. Each pixel receives incident photons (light) and converts the photons into electrical signals. Image sensors are sometimes designed to provide images to electronic devices using a Joint Photographic Experts Group (JPEG) format.

Image pixels include photodiodes that receive light and converts photons into electrical signals. A photodiode typically includes a p-n junction formed within a silicon substrate. At the p-n junction (i.e., between p-type and n-type regions) a depletion region forms and establishes an electric field. When photons are received by the substrate, holes and electrons may be generated. The holes and/or electrons can provide current flow through the p-n junction due to the electric field established by the depletion region. The electrical potential associated with the electric field varies across the p-n junction and has a dome-like shape when plotted along the length of the p-n junction. In other words, the electrical potential may reach a peak at the center across the length of the p-n junction boundary, whereas regions at the edges of the p-n junction may have somewhat lower electrical potential. The electrical potential at a given location across the length of the p-n junction is related to the amount of charge that is stored across the depletion region at that location, and therefore electrical potential profiles exhibiting dome-like shapes have unequal charge distribution along the p-n junction.

In some scenarios, a counter-doping implant is provided within the n-type region of the p-n junction to flatten the dome-like shape of the electrical potential across the length of the p-n junction. The counter-doping implant is a p-type region (i.e., doped with p-type dopants) that is fully contained within the n-type region and has a lower concentration than the n-type region to ensure that the entirety of the n-type region remains n-type (i.e., the concentration of n-type dopants within the counter-doping implant is greater than the concentration of p-type dopants).

Photodiode characteristics and performance can be constrained by fabrication process limitations. With ever-decreasing process dimensions and photodiode sizes, the amount of area that is available for the p-n junction of a photodiode is also reduced. With reductions in the amount of available p-n junction area, the pixel well capacity (i.e., the capacity of the pixel to store charge) tends to be reduced.

DETAILED DESCRIPTION

Figure 1:
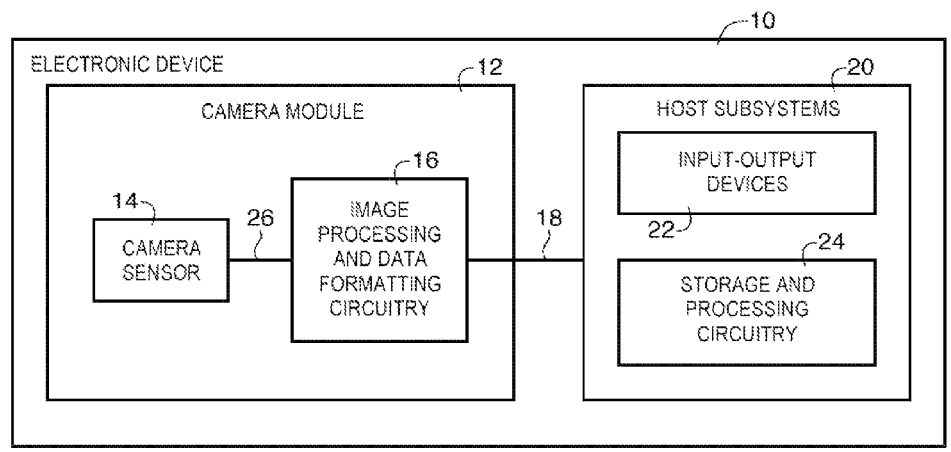
FIG. 1 is an illustrative schematic diagram of an electronic device with a camera sensor that may include pixels with improved photodiode structures in accordance with an embodiment of the present invention.

Embodiments of the present invention relate to image sensors with pixels each having a photodiode that converts received light into electrical signals. An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from camera sensor 14 may be provided to image processing and data formatting circuitry 16 via path 26. Image processing and data formatting circuitry 16 may be used to perform image processing functions such as three-dimensional depth sensing, data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SOC) arrangement, camera sensor 14 and image processing and data formatting circuitry 16 are implemented on a common integrated circuit (e.g., on a single imager substrate). The use of a single integrated circuit to implement camera sensor 14 and image processing and data formatting circuitry 16 can help to reduce costs.

Camera module 12 may convey acquired image data to host subsystems 20 over path 18 (e.g., image processing and data formatting circuitry 16 may convey image data to subsystems 20). Electronic device 10 typically provides a user with numerous high-level functions. In a computer or advanced cellular telephone, for example, a user may be provided with the ability to run user applications. To implement these functions, host subsystem 20 of electronic device 10 may include storage and processing circuitry 24 and input-output devices 22 such as keypads, input-output ports, joysticks, and displays. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, or other processing circuits.

Figure 2:
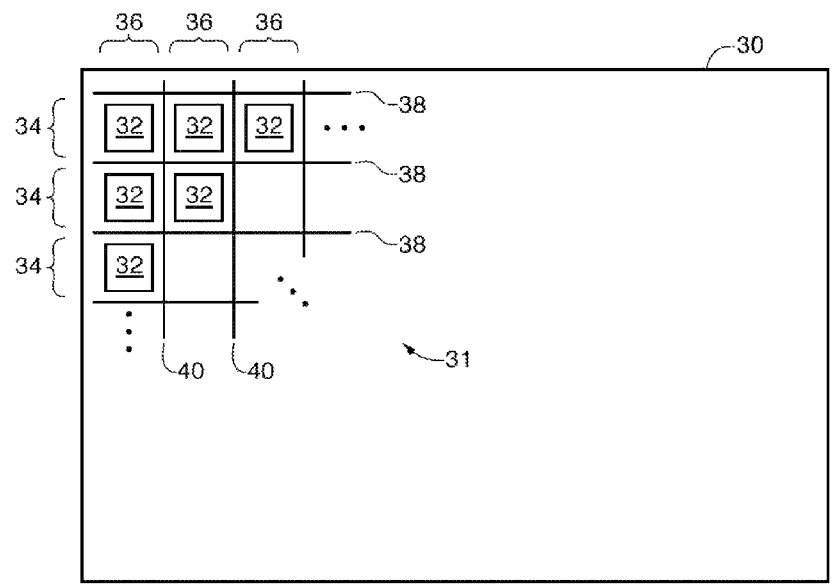
FIG. 2 is an illustrative diagram of a pixel array formed on a substrate that may include improved photodiode structures in accordance with an embodiment of the present invention.

FIG. 2 is a diagram of an illustrative pixel array 30 including pixels 32 formed on substrate 30. Substrate 30 may be a semiconductor substrate such as a silicon substrate. As shown in FIG. 2, pixels 32 may be arranged in rows 34 and columns 36. Pixel array 30 may include any desired number of rows and columns. Row lines (paths) 38 may be formed from conductive materials such as metals and may serve to convey signals to and/or from pixels 32. For example, row lines 38 may be used in conveying pixel control signals such as transfer gate control signals, reset signals, row select signals, and other pixel control signals. As another example, column lines 40 may convey pixel signals such as pixel output signals from pixels 32 (e.g., pixel output signals associated with charge stored by photodiodes during integration periods). Pixel signals such as control and output signals may be conveyed between pixels 32 and other circuitry such as readout circuitry, driver circuitry, or other circuitry formed on substrate 30 or external, off-chip circuitry.

Figure 3:
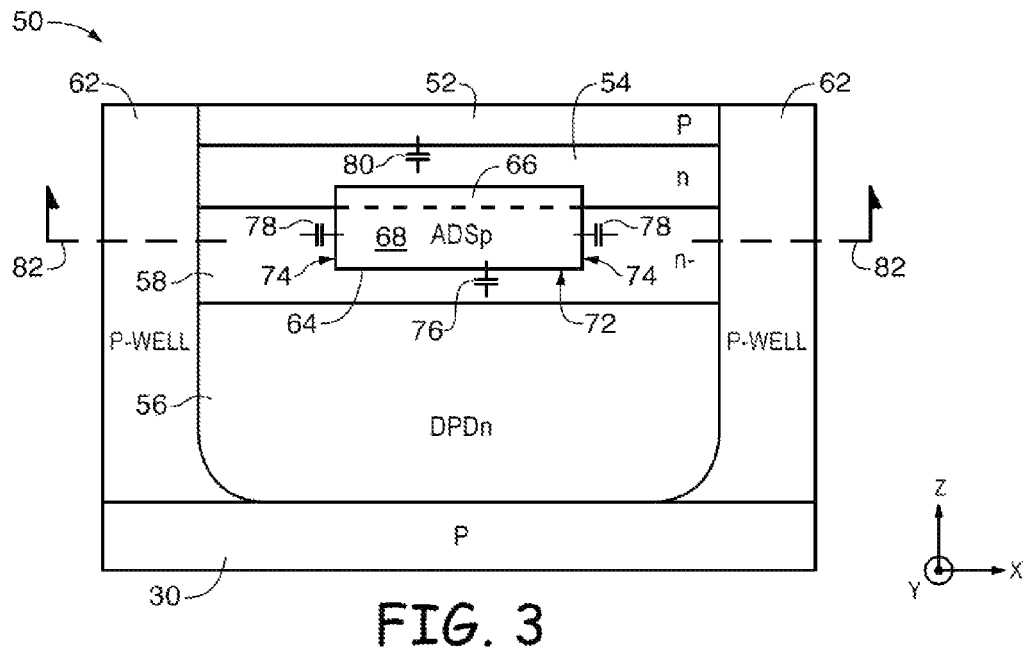
FIG. 3 is an illustrative cross-sectional diagram of a photodiode formed on a substrate that may include an anti-dome and stratification implant region in accordance with an embodiment of the present invention.

Pixels 32 may include photodiodes that receive and convert incident light into the pixel output signals. The photodiodes may be formed in portions of substrate 30. FIG. 3 is an illustrative cross-sectional view of a photodiode 50 formed within substrate 30. P-well 62 may be formed by doping a region of substrate 30. Photodiode 50 may include layers 52, 54, 56, and 58, which may be formed by doping portions of substrate 30 (e.g., within p-well 62). As shown in FIG. 3, photodiode 50 may include a p-type layer 52 adjacent to an n-type layer 54 that forms a p-n junction. P-type layer 52 may cover n-type layer 54. P-type layer 52 may be a region of substrate 30 that is doped with p-type dopants (e.g., group III elements of the periodic table such as boron or other p-type dopants that serve to provide mobile holes). N-type layer 54 may be a region of substrate 30 that is doped with n-type dopants (e.g., group V elements of the periodic table such as arsenic or phosphorous or other n-type dopants that serve as electron donors).

A depletion region may be formed at the p-n junction (e.g., formed at the intersection of layer 52 and layer 54 and across axis X). The depletion region may extend into p-type layer 52 and n-type layer 54. The width (e.g., thickness) of the depletion region may depend on the dopant concentrations of p-type layer 52 and n-type layer 54 and the charge stored at the boundaries of the depletion region (e.g., charge provided due to the generation of holes and/or electrons from incident photons). If desired, n-type deep photodiode (DPDn) region 56 may include additional p-type and n-type layers that are formed adjacent to each other and serve as additional p-n junctions. For example, the depth (along the z-axis) at which incident light penetrates photodiode 50 may be determined by the wavelength of the incident light. Vertical stratification in which multiple p-n junctions are formed may provide improved charge storage capacity for various wavelengths of light.

Implant region 64 of substrate 30 may be counter-doped relative to layers 54 and 58. In other words, region 64 may have an opposite doping type relative to layers 54 and 58. In the example of FIG. 3, counter-doping region 64 may be p-type, because layers 54 and 58 are n-type. Counter-doping region 64 may include portions 66 and 68. Portion 66 may overlap with n-type layer 54, whereas portion 68 may overlap with layer 58. Portion 66 of counter-doping region 64 may be effectively n-type, because n-type layer 54 has a greater concentration of n-type dopants than the concentration of p-type dopants within region 64. The counter-doping of region 66 may help provide more equal distribution of charge storage along the length of the pixel (i.e., the X-axis) while maintaining the overall n-type profile of layer 54. By providing more equal distribution of charge, portion 66 may provide an anti-dome effect in which electrical potential across the X-axis is flattened.

Portion 68 of implant region 64 may extend into n-type region 58. N-type region 58 may be a lightly doped n-type region having a concentration of n-type dopants that is less than the concentration of p-type dopants of region 64. Therefore, portion 68 of region 64 may be substantially p-type (e.g., because there are more p-type dopants than n-type dopants within portion 68). Portion 68 of region 64 that is substantially p-type may form additional p-n junctions between region 64 and surrounding n-type region 58. An additional depletion region may be formed at the intersection between portion 68 of region 64 and n-type region 58. The p-n junction between p-type portion 68 and n-type region 58 may provide additional capacitance for use in storing charge and may therefore increase the capacity of photodiode 50. Capacitance 76 at the p-n junction at lower surface 72 of region 64 and capacitances 78 at the p-n junctions at side surfaces 74 of region 64 may help increase the capacity of photodiode 50 to store charge.

Capacitances 76 and 78 may contribute in addition to capacitance 80 associated with the p-n junction between p-type layer 52 and n-type layer 54. The separation of charge storage between p-n junctions between layer 52 and layer 54 and between bottom surface 72 of region 64 and layer 58 may sometimes be referred to as vertical stratification, because charge is separated along the vertical Z-axis (i.e., at different depths within substrate 30). The separation of charge storage between p-n junctions at each side surface 74 of region 64 may sometimes be referred to as horizontal stratification, because charge is separated along the horizontal length of substrate 30 (i.e., at different locations along the horizontal X-axis). Region 64 including portions 66 and portions 68 may sometimes be referred to herein as an anti-dome and stratification (ADS) implant region, because implant region 64 provides both anti-dome effects and stratification of charge storage.

Figure 4:
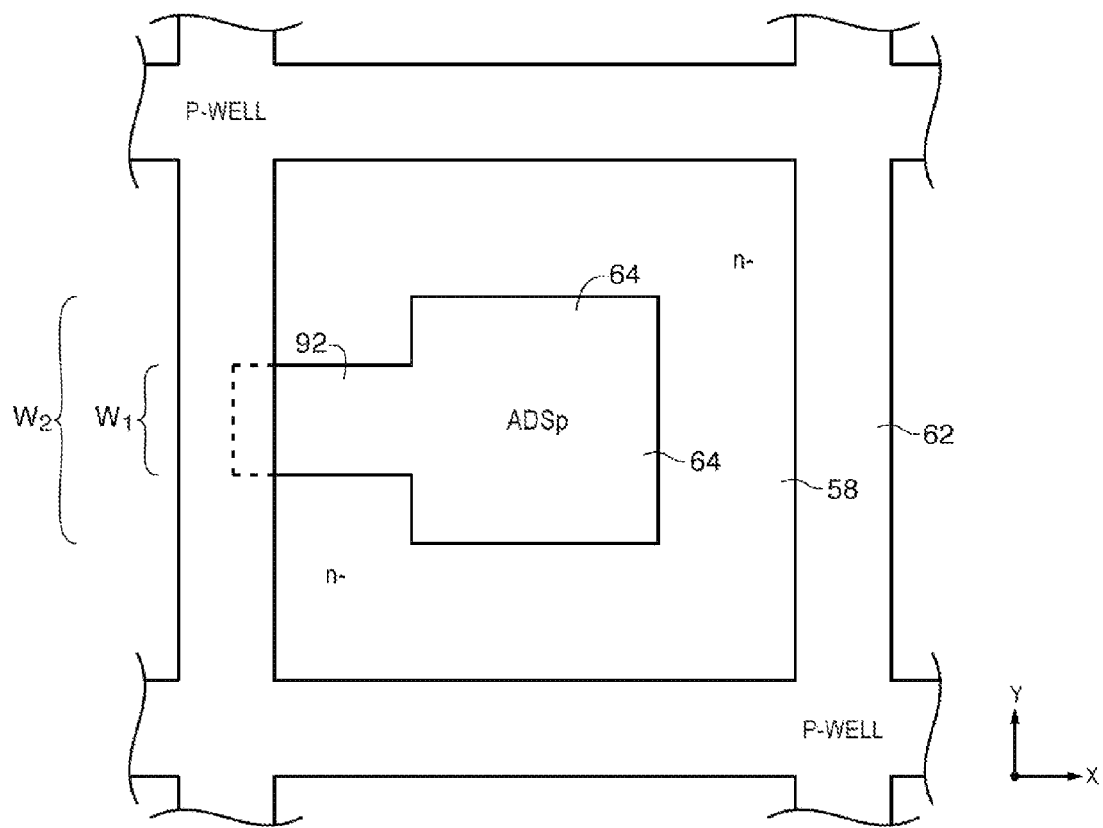
FIG. 4 is an illustrative diagram of a photodiode formed on a substrate that may include an anti-dome and stratification implant region that contacts a p-well portion in accordance with an embodiment of the present invention.

If desired, p-type ADS region 64 and p-well 62 may be electrically coupled using an extension portion of ADS region 64. FIG. 4 is an illustrative horizontal cross-section across plane 82 of FIG. 3. As shown in FIG. 4, ADS implant region 64 that is formed within p-well 62 may be surrounded by portions of p-well 62. ADS implant region 64 may include an extension portion that contacts p-well 62 and serves to electrically couple ADS implant region 64 and p-well 62 (e.g., ADS implant region 64 is grounded to p-well 62). Extension portion 92 may have a width W1 that is less than width W2 of ADS implant region 64, to help maximize the available surface area that a forms p-n junction between ADS implant region 64 and layer 58.

Figure 5:
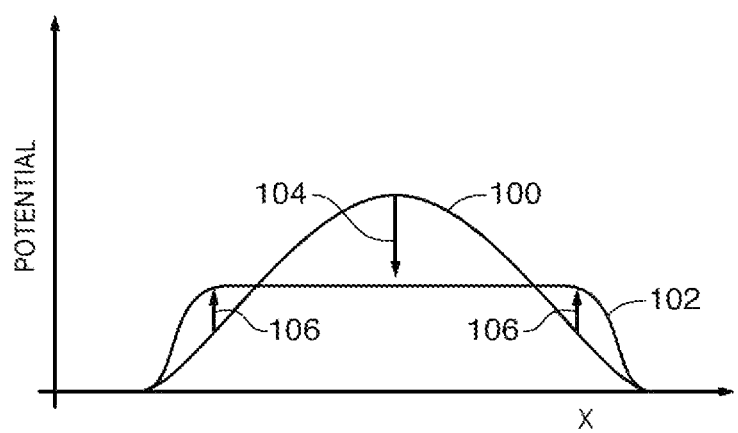
FIG. 5 is an illustrative diagram showing how a photodiode provided with an anti-dome and stratification implant region may have an improved electrical potential profile in accordance with an embodiment of the present invention.

FIG. 5 is an illustrative plot showing how ADS implant region 64 may help to flatten the potential across the X axis of photodiode 50. Line 100 may represent the potential profile for a photodiode without ADS implant region 64, whereas line 102 may represent the potential profile for photodiode 50 with ADS implant region 64. As shown in FIG. 5, the potential across the X-axis for line 100 (without any anti-dome implants) may have a dome-like shape in which electrical potential peaks at the center of the photodiode and decreases towards the edges of the photodiode. In contrast, the potential of line 102 at the center may be reduced (as shown by arrow 104) and the potential at the edges may be increased (as shown by arrows 106) relative to line 100. The example of FIG. 5 in which the potential at the edges of photodiode 50 (e.g., proximate to surrounding p-well regions) is increased is merely illustrative. The potential at the edges of photodiode 50 may remain substantially equal to or may be reduced relative to line 100.

Figure 6:
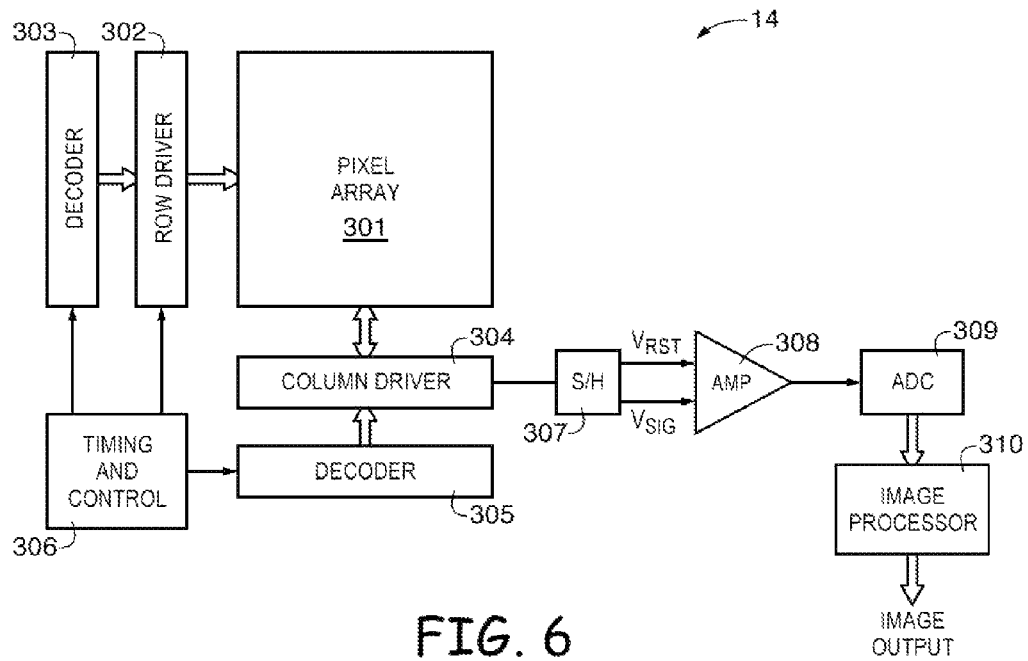
FIG. 6 is a block diagram of an imager employing pixels with improved photodiode structures in accordance with an embodiment of the present invention.

FIG. 6 illustrates a simplified block diagram of an imager 14, for example a CMOS imager, employing a pixel array 301 having pixels with photodiodes that include ADS implant regions such as implant region 64 of FIGS. 3 and 4. Pixel array 301 may, for example, be substantially similar to pixel array 31 of FIG. 2. Pixel array 301 includes a plurality of pixels arranged in a predetermined number of columns and rows. The row lines are selectively activated by the row driver 302 in response to row address decoder 303 and the column select lines are selectively activated by the column driver 304 in response to column address decoder 305. Thus, a row and column address is provided for each pixel.

Imager 14 is operated by a timing and control circuit 306, which controls decoders 303 and 305 for selecting the appropriate row and column lines for pixel readout, and row and column driver circuitry 302, 304, which apply driving voltages to the drive transistors of the selected row and column lines. The pixel signals, which typically include a pixel reset signal Vrst and a pixel image signal Vsig for each pixel (or each photosensitive region of each pixel) are sampled by sample and hold circuitry 307 associated with the column driver 304. A differential signal Vrst-Vsig is produced for each pixel (or each photosensitive area of each pixel), which is amplified by an amplifier 308 and digitized by analog-to-digital converter 309. The analog to digital converter 309 converts the analog pixel signals to digital signals, which are fed to an image processor 310 which forms a digital image. Image processor 310 may, for example, be provided as part of image processing and data formatting circuitry 16 of FIG. 1.

Figure 7:
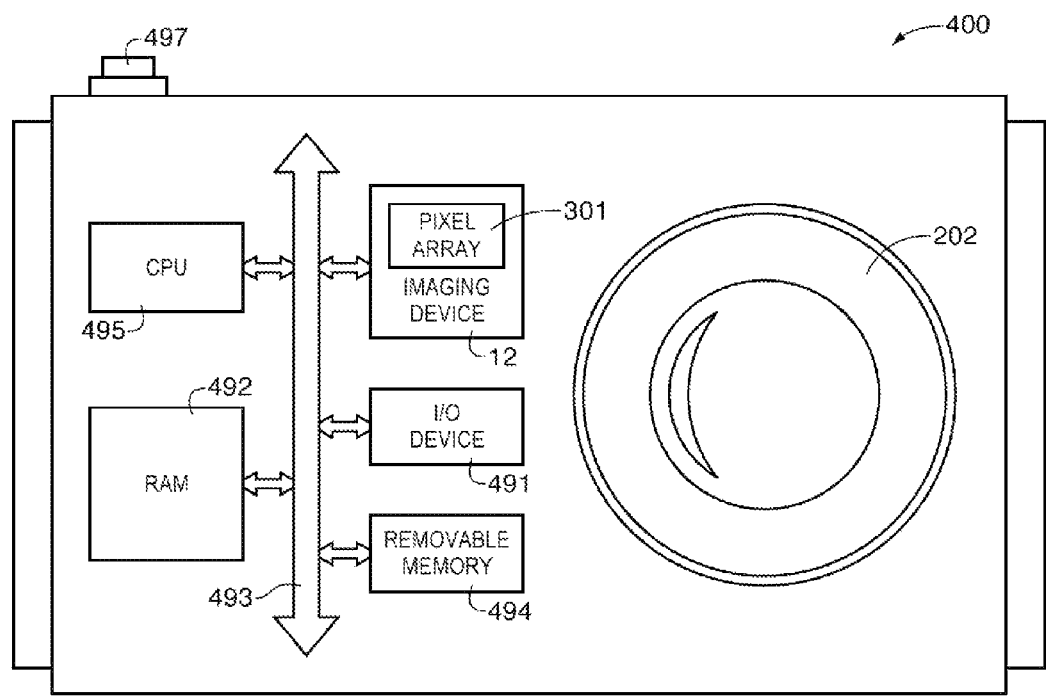
FIG. 7 is a block diagram of a processor system employing the imager of FIG. 6 in accordance with an embodiment of the present invention.

FIG. 7 is a simplified diagram of an illustrative processor system 400, such as a digital camera, which includes an imaging device 12 (e.g., the camera module of FIG. 1) employing an imager having pixels with improved photodiode structures as described above. The processor system 400 is exemplary of a system having digital circuits that could include imaging device 12. Without being limiting, such a system could include a computer system, still or video camera system, scanner, machine vision system, vehicle navigation system, video phone, surveillance system, auto focus system, star tracker system, motion detection system, image stabilization system, and other systems employing an imaging device.

Processor system 400, for example a digital still or video camera system, generally includes a lens 202 for focusing an image on pixel array 301 when a shutter release button 497 is pressed, central processing unit (CPU) 495, such as a microprocessor which controls camera and one or more image flow functions, which communicates with one or more input/output (I/O) devices 491 over a bus 493. Imaging device 12 also communicates with CPU 495 over bus 493. System 400 also includes random access memory (RAM) 492 and can optionally include removable memory 494, such as flash memory, which also communicates with CPU 495 over the bus 493. Imaging device 12 may be combined with the CPU, with or without memory storage on a single integrated circuit or on a different chip. Although bus 493 is illustrated as a single bus, it may be one or more busses, bridges or other communication paths used to interconnect system components of system 400.

Various embodiments have been described illustrating photodiodes having anti-dome and stratification (ADS) implant regions. The photodiodes may form part of pixels that serve to convert incident light into electrical signals for imagers. The photodiodes may be formed on a substrate such as a silicon substrate. The photodiode may include first and second layers in the substrate that form a p-n junction. The first layer may have a first doping type such as p-type doping, whereas the second layer may have a second, opposite doping type such as n-type doping. A counter-doping implant region may be provided in the substrate and only partially overlaps with the second layer of the photodiode. The counter-doping implant region may have an opposite doping type of the second layer (e.g., the counter-doping implant region may be a p-type implant region) and may serve as an anti-dome and stratification implant region.

The second layer may have a first dopant concentration, whereas the counter-doping implant region may have a second dopant concentration that is less than the first dopant concentration so that the overall doping type of the second layer is not affected by the counter-doping implant region. The counter-doping implant region may extend into a third layer of the substrate that is covered by the second layer (e.g., the third layer is below the second layer). The third layer of the substrate may have the same doping type of the second layer but at a lower concentration so that the portion of the counter-doping implant region that overlaps with the third layer is not affected by the third layer. For example, the third layer may have a third dopant concentration that is less than the second dopant concentration and the first dopant concentration. If desired, the photodiode may be formed within a well such as a p-well and the counter-doping implant region may contact the p-well so as to electrically ground the implant region (e.g., to a pixel supply ground voltage).

The foregoing is merely illustrative of the principles of this invention and various modifications can be made by those skilled in the art without departing from the scope and spirit of the invention.

What is claimed is:

1. An imaging pixel, comprising:
   a substrate;
   a first layer of a first doping type in the substrate;
   a second layer of a second doping type in the substrate, wherein the first and second layers form a p-n junction and the second layer is directly beneath the first layer;
   a third layer of the second doping type in the substrate, wherein the third layer is directly beneath the second layer; and
   a counter-doping implant region in the substrate, wherein the counter-doping implant region has a first portion that extends into the second layer and a second portion that extends into the third layer.

2. The imaging pixel defined in claim 1 wherein the first layer of the first doping type comprises a p-type layer.

3. The imaging pixel defined in claim 2 wherein the second layer of the second doping type comprises an n-type layer.

4. The imaging pixel defined in claim 3 wherein the counter-doping implant region comprises a p-type implant region.

5. The imaging pixel defined in claim 4 wherein the n-type layer has a first dopant concentration, wherein the p-type implant region has a second dopant concentration, and wherein the second dopant concentration is less than the first dopant concentration.

6. The imaging pixel defined in claim 5 wherein the p-type implant region is surrounded above, below and on at least two sides by the second layer and the third layer.

7. The imaging pixel defined in claim 6 wherein the third layer of the second doping type has a concentration of n-type dopants that is less than the first dopant concentration.

8. The imaging pixel defined in claim 7 wherein the concentration of n-type dopants in the third layer is less than the second dopant concentration of the p-type implant region.

9. The imaging pixel defined in claim 8 further comprising a p-well in the substrate, wherein the p-type implant region contacts the p-well.

10. A photodiode, comprising:
a substrate;
first and second layers that form a first p-n junction in the substrate;
a third layer in the substrate; and
an implant region of a single doping type in the substrate, wherein the implant region has a first portion that extends into the second layer and a second portion that extends into the third layer and forms a second p-n junction with the third layer in the substrate.

11. The photodiode defined in claim 10 wherein the first layer is doped with p-type dopants, wherein the second layer is doped with n-type dopants, and wherein the implant region is doped with p-type dopants.

12. The photodiode defined in claim 11 wherein the second layer is doped with a first concentration of the n-type dopants, wherein the implant region is doped with a second concentration of the p-type dopants, and wherein the second concentration is less than the first concentration.

13. The photodiode defined in claim 12 wherein the third layer in the substrate is doped with n-type dopants.

14. The photodiode defined in claim 13 wherein the third layer is doped with a third concentration of the n-type dopants that is less than the second concentration of the p-type dopants of the implant region.

15. A system, comprising:
a central processing unit;
memory;
input-output circuitry; and
an imaging device, wherein the imaging device comprises:
a pixel array formed in a substrate; and
a lens that focuses an image on the pixel array, wherein the pixel array includes at least one photodiode comprising:
a p-n junction in the substrate; and
an implant region of a single doping type that only partially overlaps with a portion of the p-n junction and counter-dopes the overlapped portion of the p-n junction.

16. The system defined in claim 15 wherein the p-n junction in the substrate comprises:
a p-type region; and
an n-type region, wherein the implant region partially overlaps with the portion of the n-type region.

17. The system defined in claim 16 wherein the implant region is implanted with p-type dopants.

18. The system defined in claim 17 wherein the implant region has a first dopant concentration, wherein the n-type region has a second dopant concentration that is greater than the first dopant concentration.

19. The system defined in claim 18 wherein the photodiode further comprises:
an n-type layer in the substrate, wherein the implant region partially overlaps with the n-type layer in the substrate.

20. The system defined in claim 19 wherein the n-type layer in the substrate has a third dopant concentration that is less than the first dopant concentration.

\* \* \* \* \*